(12) United States Patent
Consolini et al.

(10) Patent No.: US 7,130,049 B2
(45) Date of Patent: Oct. 31, 2006

(54) METHOD OF MEASUREMENT, METHOD FOR PROVIDING ALIGNMENT MARKS, AND DEVICE MANUFACTURING METHOD

(75) Inventors: Joseph J. Consolini, Costa Mesa, CA (US); Keith Frank Best, Prunedale, CA (US); Alexander Friz, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 349 days.

(21) Appl. No.: 10/744,091

(22) Filed: Dec. 24, 2003

(65) Prior Publication Data

US 2005/0146721 A1 Jul. 7, 2005

(51) Int. Cl.
*G01B 11/00* (2006.01)
(52) U.S. Cl. .................................................. 356/399
(58) Field of Classification Search ........ 356/399–401; 355/53, 43; 250/548
See application file for complete search history.

(56) References Cited

U.S. PATENT DOCUMENTS

| | | | |
|---|---|---|---|
| 5,298,988 A * | 3/1994 | Everett et al. ............. | 348/87 |
| 5,361,132 A * | 11/1994 | Farn ......................... | 356/509 |
| 5,545,593 A | 8/1996 | Watkins et al. | |
| 5,952,694 A * | 9/1999 | Miyawaki et al. ......... | 257/347 |
| 6,376,329 B1 | 4/2002 | Sogard et al. | |
| 6,416,912 B1 | 7/2002 | Kobayashi et al. | |
| 6,768,539 B1 * | 7/2004 | Gui et al. .................. | 355/53 |

FOREIGN PATENT DOCUMENTS

EP 1 223 469 A1 7/2002

OTHER PUBLICATIONS

Search Report for European Application No. 04257805.4-2222—dated Apr. 11, 2005.

* cited by examiner

*Primary Examiner*—Gregory J. Toatley, jr.
*Assistant Examiner*—Isiaka O. Akanbi
(74) *Attorney, Agent, or Firm*—Pillsbury Winthrop Shaw Pittman, LLP

(57) ABSTRACT

In a method of measurement according to one embodiment of the invention, a relative position of a temporary alignment mark on one side of a substrate and an alignment mark on the other side of the substrate is determined, and the temporary alignment mark is removed. Before removal of the temporary alignment mark, a relative position of that mark and another mark on the same side of the substrate may be determined. The temporary alignment mark may be formed in, e.g., an oxide layer.

48 Claims, 3 Drawing Sheets

METHOD OF MEASUREMENT, METHOD FOR PROVIDING ALIGNMENT MARKS, AND DEVICE MANUFACTURING METHOD

FIELD OF THE INVENTION

The present invention relates to lithographic apparatus and methods.

BACKGROUND

The term "patterning structure" as here employed should be broadly interpreted as referring to any structure or field that may be used to endow an incoming radiation beam with a patterned cross-section, corresponding to a pattern that is to be created in a target portion of a substrate; the term "light valve" can also be used in this context. It should be appreciated that the pattern "displayed" on the patterning structure may differ substantially from the pattern eventually transferred to e.g. a substrate or layer thereof (e.g. where pre-biasing of features, optical proximity correction features, phase and/or polarization variation techniques, and/or multiple exposure techniques are used). Generally, such a pattern will correspond to a particular functional layer in a device being created in the target portion, such as an integrated circuit or other device (see below). A patterning structure may be reflective and/or transmissive. Examples of patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An array of grating light valves (GLVs) may also be used in a corresponding manner, where each GLV may include a plurality of reflective ribbons that can be deformed relative to one another (e.g. by application of an electric potential) to form a grating that reflects incident light as diffracted light. A further alternative embodiment of a programmable mirror array employs a matrix arrangement of very small (possibly microscopic) mirrors, each of which can be individually tilted about an axis by applying a suitable localized electric field, or by employing piezoelectric actuation means. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. Nos. 5,296,891 and 5,523,193 and PCT patent applications WO 98/38597 and WO 98/33096, which documents are incorporated herein by reference. In the case of a programmable mirror array, the support structure may be embodied as a frame or table, for example, which may be fixed or movable as required.

A programmable LCD panel. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask (or "reticle") and mask table (or "reticle table"); however, the general principles discussed in such instances should be seen in the broader context of the patterning structure as hereabove set forth.

A lithographic apparatus may be used to apply a desired pattern onto a surface (e.g. a target portion of a substrate). Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies and/or portion(s) thereof) on a substrate (e.g. a wafer of silicon or other semiconductor material) that has been coated with a layer of radiation-sensitive material (e.g. resist). In general, a single wafer will contain a whole matrix or network of adjacent target portions that are successively irradiated via the projection system (e.g. one at a time).

Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. A projection beam in a scanning type of apparatus may have the form of a slit with a slit width in the scanning direction. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (e.g. resist). Prior to this imaging procedure, the substrate may undergo various other procedures such as priming, resist coating, and/or a soft bake. After exposure, the substrate may be subjected to other procedures such as a post-exposure bake (PEB), development, a hard bake, and/or measurement/inspection of the imaged features. This set of procedures may be used as a basis to pattern an individual layer of a device (e.g. an IC).

For example, these transfer procedures may result in a patterned layer of resist on the substrate. One or more pattern processes may follow, such as deposition, etching, ion-implantation (doping), metallization, oxidation, chemo-mechanical polishing, etc., all of which may be intended to create, modify, or finish an individual layer. If several layers are required, then the whole procedure, or a variant thereof, may be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

A substrate as referred to herein may be processed before or after exposure: for example, in a track (a tool that typically applies a layer of resist to a substrate and develops the exposed resist) or a metrology or inspection tool. Where applicable, the disclosure herein may be applied to such and other substrate processing tools. Further, the substrate may be processed more than once (for example, in order to create a multi-layer IC), so that the term substrate as used herein may also refer to a substrate that already contains multiple processed layers.

The term "projection system" should be broadly interpreted as encompassing various types of projection system, including refractive optics, reflective optics, catadioptric systems, and charged particle optics, for example. A particular projection system may be selected based on factors such as a type of exposure radiation used, any immersion fluid(s) or gas-filled areas in the exposure path, whether a vacuum is used in all or part of the exposure path, etc. For the sake of simplicity, the projection system may hereinafter be referred to as the "lens." The radiation system may also include components operating according to any of these design types for directing, shaping, reducing, enlarging, patterning, and/or otherwise controlling the projection beam of radiation, and such components may also be referred to below, collectively or singularly, as a "lens."

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Application No. WO 98/40791, which documents are incorporated herein by reference.

The lithographic apparatus may also be of a type wherein the substrate is immersed in a liquid having a relatively high refractive index (e.g. water) so as to fill a space between the final element of the projection system and the substrate. Immersion liquids may also be applied to other spaces in the lithographic apparatus, for example, between the mask and the first element of the projection system. The use of immersion techniques to increase the effective numerical aperture of projection systems is well known in the art.

In the present document, the terms "radiation" and "beam" are used to encompass all types of electromagnetic radiation or particle flux, including ultraviolet radiation (e.g. with a wavelength of 365, 248, 193, 157 or 126 nm), EUV (extreme ultra-violet radiation, e.g. having a wavelength in the range 5–20 nm), and X-rays, as well as particle beams (such as ion or electron beams).

Although specific reference may be made in this text to the use of lithographic apparatus in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, DNA analysis devices, etc. The skilled artisan will appreciate that, in the context of such alternative applications, any use of the terms "reticle," "wafer," or "die" in this text should be considered as being replaced by the more general terms "mask," "substrate," and "target portion" (or "exposure area"), respectively.

It may be desired to form patterns on both sides of a substrate such that the patterns are aligned. For example, it may be desired to form functional features on one side of the substrate that will be correctly aligned with functional features on the other side of the substrate.

SUMMARY

A method of measurement according to an embodiment of the invention includes detecting light outgoing from at least a portion of a first alignment mark, the first alignment mark being at a first surface of a substrate. Based on said detecting, a relative position of the first alignment mark and a second alignment mark is determined, the second alignment mark being at a second surface of the substrate opposite to the first substrate. The method also includes removing the first alignment mark from the substrate.

A method of measurement according to another embodiment of the invention includes detecting light outgoing from at least a portion of a first alignment mark, the first alignment mark being at a first surface of a substrate, and removing the first alignment mark from the substrate. The detecting occurs at a location on a side of the substrate opposite to the first surface.

A method of measurement according to a further embodiment of the invention includes providing a temporary alignment mark and a first alignment mark on a first surface of a substrate, and turning over the substrate. The method also includes determining a position of the substrate, based on light outgoing from at least a portion of the temporary alignment mark and detected at a location on a side of the substrate opposite to the first surface, and providing a second alignment mark on a second surface of the substrate different from the first surface.

A substrate according to a further embodiment of the invention includes a first alignment mark formed at a first surface of the substrate and a second alignment mark formed at the first surface of the substrate. The first alignment mark is formed in a first layer of the substrate, and the second alignment mark is formed in a second layer of the substrate, the second layer being on the first layer.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Embodiments of the invention include, for example, methods and apparatus that may be used to provide alignment marks, the location of which is not constrained but yet the relative alignment of the front and back side of the substrate can still be accurately determined.

Figure 1:
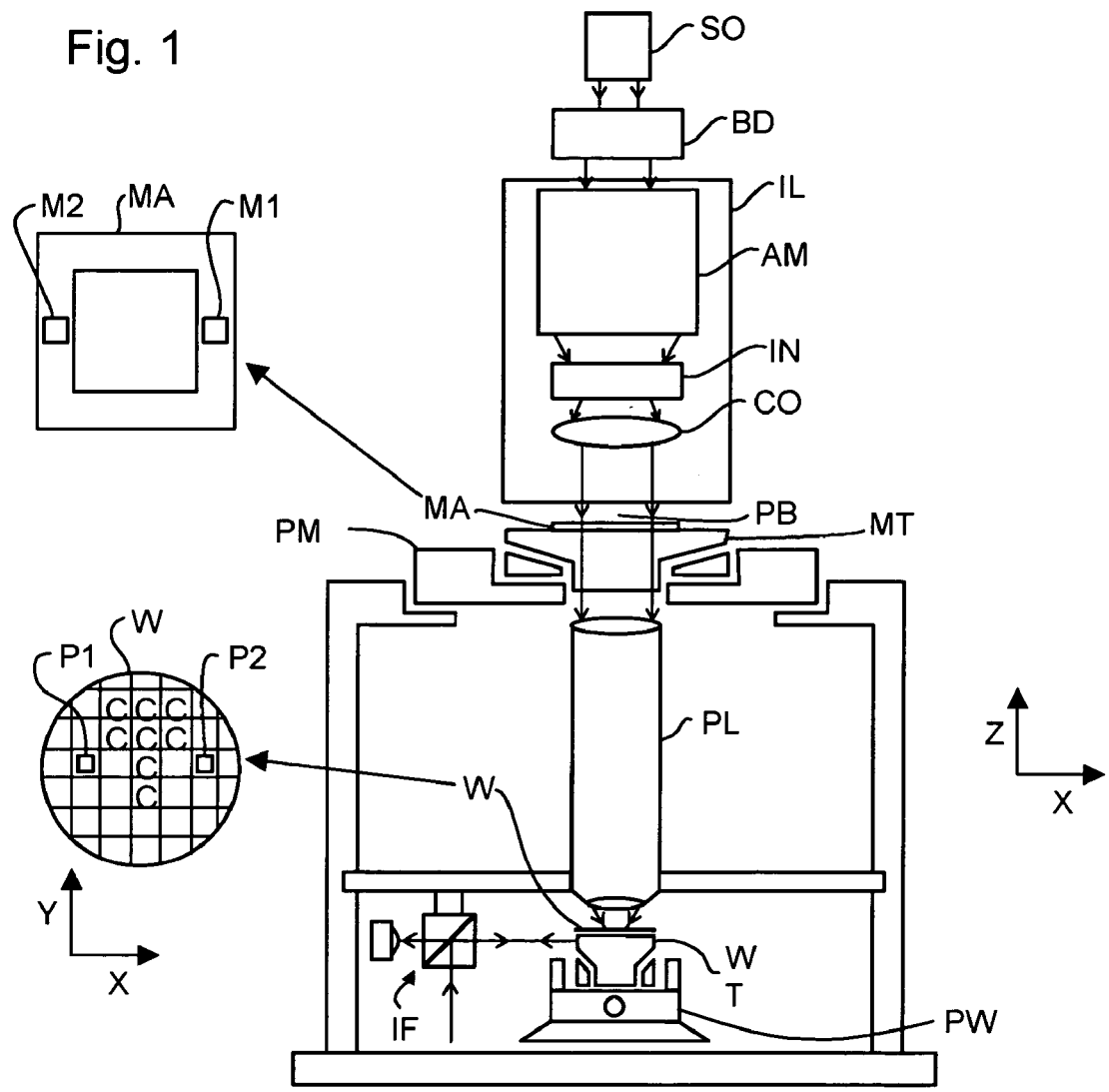
FIG. 1 depicts a lithographic apparatus according to an embodiment of the invention.

FIG. 1 schematically depicts a lithographic projection apparatus according to a particular embodiment of the invention. The apparatus comprises:

A radiation system configured to supply (e.g. having structure capable of supplying) a projection beam of radiation (e.g. UV or EUV radiation). In this particular example, the radiation system RS comprises a radiation source SO, a beam delivery system BD, and an illumination system including adjusting structure AM for setting an illumination node, an integrator IN, and condensing optics CO;

A support structure configured to support a patterning structure capable of patterning the projection beam. In this example, a first object table (mask table) MT is provided with a mask holder for holding a mask MA (e.g. a reticle), and is connected to a first positioning structure PM for accurately positioning the mask with respect to item PL;

A second object table (substrate table) configured to hold a substrate. In this example, substrate table WT is provided with a substrate holder for holding a substrate W (e.g. a resist-coated semiconductor wafer), and is connected to a second positioning structure PW for accurately positioning the substrate with respect to item PL and (e.g. interferometric) measurement structure IF, which is configured to accurately indicate the position of the substrate and/or substrate table with respect to lens PL; and A projection system ("lens") configured to project the patterned beam. In this example, projection system PL (e.g. a refractive lens group, a catadioptric or catoptric system, and/or a mirror system) is configured to image an irradiated portion of the mask MA onto a target portion C (e.g. comprising one or more dies and/or portion(s) thereof) of the substrate W. Alternatively, the projection system may project images of secondary sources for which the elements of a programmable patterning structure may act as shutters. The projection system may also include a microlens array (MLA), e.g. to form the secondary sources and to project microspots onto the substrate.

As here depicted, the apparatus is of a transmissive type (e.g. has a transmissive mask). However, in general, it may also be of a reflective type, for example (e.g. with a reflective mask). Alternatively, the apparatus may employ another kind of patterning structure, such as a programmable mirror array of a type as referred to above.

The source SO (e.g. a mercury lamp, an excimer laser, an electron gun, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a conditioning structure or field. For example, a beam delivery system BD may include suitable directing mirrors and/or a beam expander. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source SO may be within the housing of the lithographic projection apparatus (as is often the case when the source SO is a mercury lamp, for example), but that it may also be remote from the lithographic projection apparatus, the radiation beam which it produces being led into the apparatus (e.g. with the aid of suitable direction mirrors); this latter scenario is often the case when the source SO is an excimer laser. The current invention and claims encompass both of these scenarios.

The beam PB subsequently intercepts the mask MA, which is held on a mask table MT. Having traversed (alternatively, having been selectively reflected by) the mask MA, the beam PB passes through the lens PL, which focuses the beam PB onto a target portion C of the substrate W. With the aid of the second positioning structure PW (and interferometric measuring structure IF), the substrate table WT can be moved accurately, e.g. so as to position different target portions C in the path of the beam PB. Similarly, the first positioning structure PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which may form part of the structures PM, PW and are not explicitly depicted in FIG. 1. However, in the case of a wafer stepper (as opposed to a step-and-scan apparatus) the mask table MT may just be connected to a short stroke actuator (e.g. to make fine adjustments in mask orientation and position) or may be fixed. Mask MA and substrate W may be aligned using mask alignment marks M1, M2 and substrate alignment marks P1, P2.

The depicted apparatus can be used in several different modes:

1. In step mode, the mask table MT is kept essentially stationary, and an entire mask image is projected at once (i.e. in a single "flash") onto a target portion C. The substrate table WT is then shifted in the x and/or y directions so that a different target portion C can be irradiated by the beam PB. In step mode, a maximum size of the exposure field may limit the size of the target portion imaged in a single static exposure;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). The velocity and/or direction of the substrate table WT relative to the mask table MT may be determined by magnification, demagnification (reduction), and/or image reversal characteristics of the projection system PL. In this manner, a relatively large target portion C can be exposed, without having to compromise on resolution. In scan mode, a maximum size of the exposure field may limit the width (in the non-scanning direction) of the target portion exposed in a single dynamic exposure, whereas the length of the scanning motion may determine the height (in the scanning direction) of the target portion exposed;

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations of and/or variations on the above-described modes of use or entirely different modes of use may also be employed.

Before exposing a substrate, it may be desirable to correctly align the substrate, e.g. to ensure accurate projection of the functional features. FIG. 1 shows an example of complementary alignment marks $M_1$, $M_2$ and substrate marks $P_1$, $P_2$ present on a mask and substrate, respectively. An alignment system may be used to detect alignment e.g. with reference to such marks. Examples of alignment systems include a conventional through-the-lens alignment system and also the alignment methods and apparatus described in co-pending European Patent Applications Nos. 02251440 and 02250235.

Figure 2:
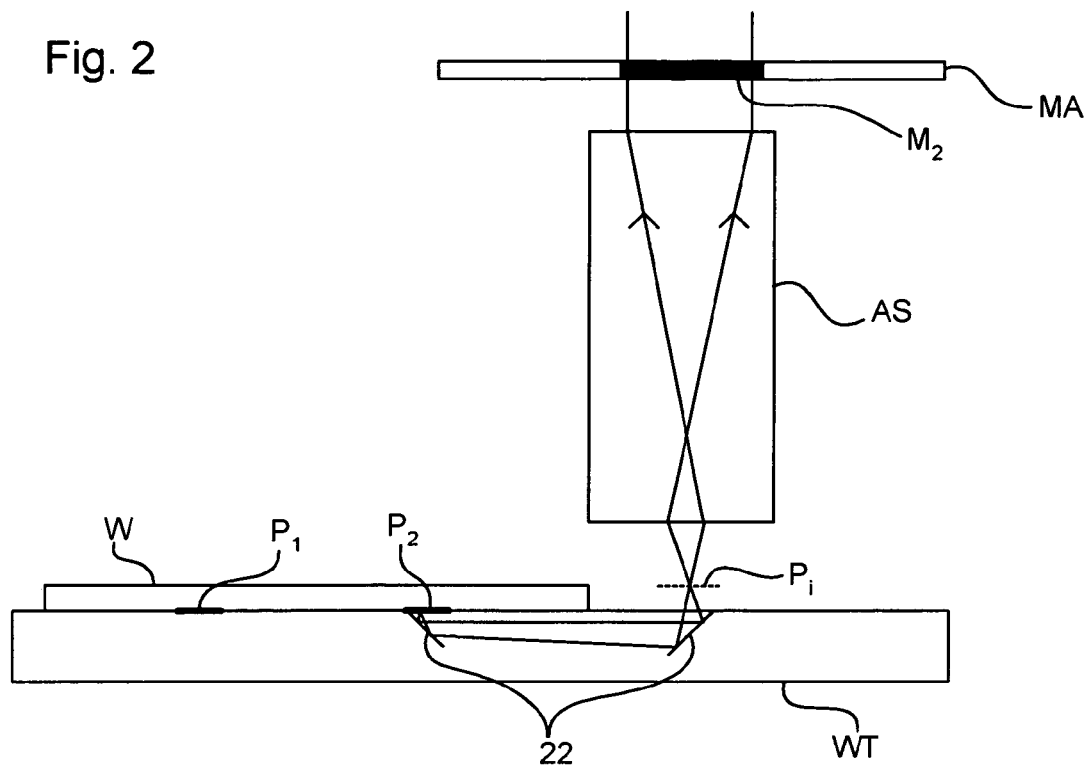
FIG. 2 depicts front-to-back side alignment apparatus together with a conventional substrate with alignment marks.

An alignment mark is commonly on the front side of the substrate, but can also be on the back side of the substrate. Marks on the back side of the substrate are used, for example, when exposure is to take place on both sides of the substrate. Such exposure occurs particularly in the manufacture of micro electro-mechanical systems (MEMS) or micro opto-electro-mechanical systems (MOEMS). When the substrate marks $P_1$ and $P_2$ are on the back surface of the substrate, they may be re-imaged e.g. by front-to-back side alignment optics 22 at the side of substrate W to form an image $P_i$ as shown for $P_2$ in FIG. 2 ($P_1$ may be re-imaged by another branch of the front-to-back side alignment optics) of the accompanying drawings. The front-to-back side alignment optics, together with the alignment system AS, may be used to determine the relative position of marks on the front side of the substrate to marks on the back side of the substrate. Such a determination may enable functional features exposed on the front side of the substrate to be correctly lined up with functional features exposed on the back side of the substrate.

The front-to-back side alignment optics may be embedded in the substrate table, and therefore it may be desirable or necessary for the alignment mark on the back side of the substrate to be arranged at certain positions on the substrate, e.g. to be within the field of view of the front-to-back side alignment optics. Fixing the position of alignment marks on the back side of the substrate may restrict the scope of design of functional features (e.g. it may not be possible to have functional features in the same position as the alignment marks on the back side of the substrate) and may reduce the number of devices that can be fitted on a substrate. Such constraints may also prevent large-scale integrated circuits and devices from being manufactured by such a process.

Figure 3:
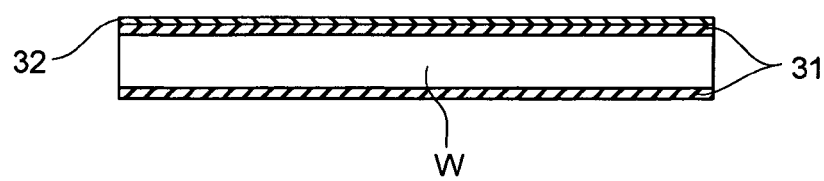
FIG. 3 depicts a substrate prior to processing.

A substrate W made of silicon is covered in a layer of silicon dioxide. This result can be achieved by, for example, chemical vapour deposition or growth of a thermal oxide. As shown in FIG. 3, the temporary layer 31 of silicon dioxide should be thin (e.g. on the order of 5000 angstroms) and uniform across both sides of the substrate. In addition to being used in processing operations as described below, the resist may also form a protective layer e.g. preventing accidental damage to either side of the substrate. Any method of providing a thin dielectric layer can be used, such as chemical vapour deposition, as illustrated, plasma-enhanced chemical vapour deposition, sputtering, or epitaxial growth. Although the example used here is of a layer of silicon dioxide, it could also be a layer of silicon nitride or any other thin film. Dielectric films have been used in particular. A layer of radiation-sensitive photoresist (resist) 32 is then applied to the upper surface of the substrate covering the temporary layer 31. Alternatively resist 32 could be applied to both surfaces of the substrate W. In a further alternative, a particle beam or mechanical etch process may be used instead.

Figure 4:
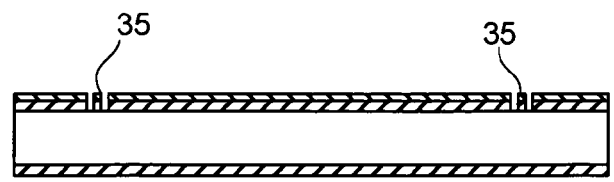
FIG. 4 depicts a substrate with temporary alignment marks.

Temporary alignment marks 35 are then etched into the silicon dioxide layer 31, as illustrated in FIG. 4. These temporary alignment marks 35 may be located at positions fixed by the arrangement of the front-to-back side alignment optics such that these temporary alignment marks 35 will be visible in the field of view of the front-to-back side alignment optics. The shape of the temporary alignment mark is exposed in the layer of resist 32. The exposed photoresist is then developed and the silicon dioxide below etched. This is preferably a dry etch to create a particularly clean etch but hydrofluoric acid, for example, could also be used. Alternatively, a particle beam or mechanical etch process may be used instead.

The position of the permanent alignment marks 40 may be governed by the design of the substrate as a whole. Such an arrangement may enable large integrated circuits to be manufactured. Although the position of the permanent alignment marks 40 may be governed by the design of the substrate as a whole, the position of them may be measured relative to the temporary alignment marks 35. However, such position could be measured relative to some other reference point, such as the edge of the substrate W or a fiducial mark on the substrate table WT.

Figure 5A:
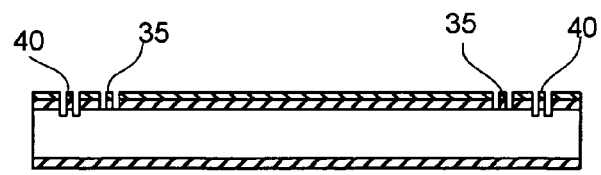
FIG. 5A depicts a cross-section of a substrate having temporary alignment marks and first permanent alignment marks.
Figure 5B:
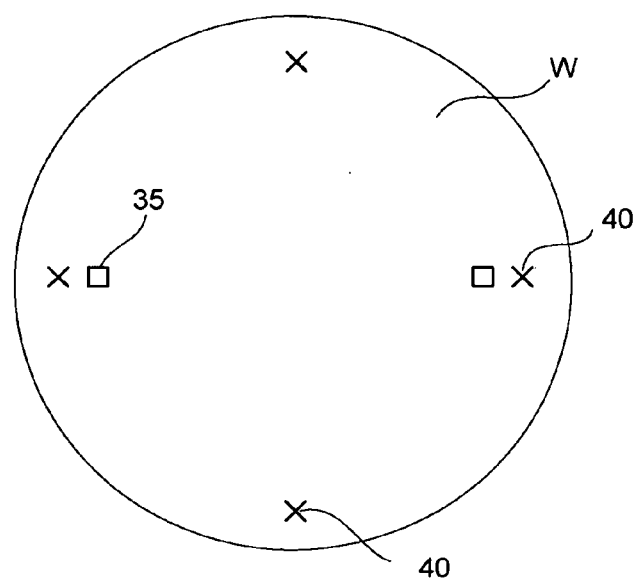
FIG. 5B is a top view of a substrate with temporary alignment marks and first permanent alignment marks.

The shape of the first permanent alignment marks 40 is exposed in the photoresist and the silicon dioxide below is removed. The alignment marks can then be etched into the silicon using e.g. potassium hydroxide, plasma etching, or any other appropriate etching method. An arrangement of temporary alignment marks 35 and first permanent alignment marks 40 is shown in FIG. 5B. This arrangement includes four first permanent alignment marks 35 which are not arranged in a straight line. Arrangement of the marks in a two-dimensional rather than a solely one-dimensional array may enable better alignment of the substrate across the whole two-dimensional plane of the substrate W.

Figure 6:
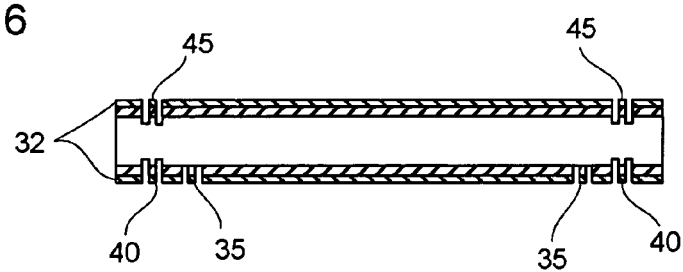
FIG. 6 depicts a substrate with first and second permanent alignment marks and temporary alignment marks.
Figure 7:
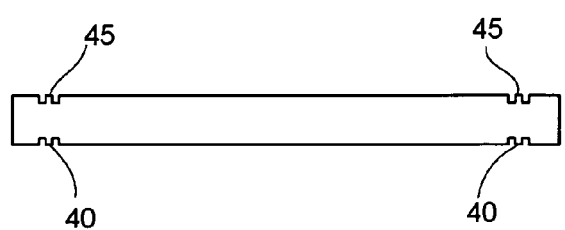
FIG. 7 depicts the substrate shown in FIG. 6 with the temporary layer removed.

The substrate is then turned over such that the as-yet-unetched side of the substrate is uppermost, and a layer of resist is applied to the upper surface of the substrate. The temporary alignment marks 35 are then in the field of view of the front-to-back side alignment optics, and the position of these can thus be accurately ascertained. The position of the second permanent alignment marks 45, although governed by the design of the substrate as a whole, is measured relative to the known position of the temporary alignment marks 35. The position of the first and second permanent alignment marks, 40, 45 are therefore known accurately relative to each other, and the position of any functional element on one side of the substrate is known relative to any functional element on either side of the substrate. Overlay accuracies of less than 100 nm may therefore be achievable. Although the permanent alignment marks shown in FIG. 6 are depicted as being directly opposite each other, this need not be the case, and they could be at different positions on the substrate. The second permanent alignment marks are exposed and etched into the silicon e.g. using a process as described above.

The layer of resist 32 and temporary layer of silicon dioxide 31 are then removed to leave the substrate with just the first and second permanent alignment marks. To expose any functional elements on the substrate, the position can be calculated relative to the alignment mark visible on the top surface of the substrate at that time. It is possible that no further use of the front-to-back side alignment optics is therefore necessary.

For improved results, it may be desirable for the mask used to expose the alignment marks to have the alignment marks placed at the center of the optical field in order (e.g. to reduce distortion from the imaging lens system).

The term "substrate" is used herein to encompass an object to be processed (e.g. a semiconductor wafer) as well as any layers that may be on the object. A feature that is "formed at a surface" of an object is a feature that is within and/or proximate to the surface (e.g. as opposed to another surface of the object); such a feature may be formed in the surface, on the surface, through the surface, and/or under the surface. For example, a feature formed in a first superficial layer of a substrate that is beneath a second superficial layer, and a feature that is formed underneath and proximate to the first superficial layer, are both features that are "formed at a surface" of the substrate.

Embodiments of the present invention include methods of providing alignment marks on substrates manufactured in lithographic apparatus. A method of providing alignment marks on a substrate according to one embodiment of the invention includes providing a substrate; providing a temporary alignment mark and a first alignment mark on a surface of the substrate; turning over the substrate; using front-to-back side alignment optics provided in an alignment apparatus to align the substrate using the temporary alignment mark; and providing a second alignment mark on a different surface of the substrate from the first alignment mark.

Once the relative position of the first alignment mark and the temporary alignment mark is known, and the relative position of the temporary alignment mark and the second alignment mark is known, the relative position of the first and second alignment marks may therefore also be known. Alignment of the substrate can take place using just the alignment marks shown on the front of the substrate at that time. After this initial use of the front-to-back side alignment optics, they may no longer be necessary, and the temporary alignment marks can be removed. It may be desirable to provide the same number of temporary alignment marks as there are branches to the front-to-back side alignment optics, e.g. so the field of view of each branch of the front-to-back side alignment optics contains one temporary alignment mark.

Such a method may optionally comprise the further element of providing a temporary layer on a surface of the substrate, the temporary alignment mark being etched into the temporary layer. Once use of the temporary alignment marks is finished, for example, the temporary layer can simply be removed, thereby removing the temporary alignment marks. The temporary layer may be dielectric; in particular, it may be a nitride layer, or an oxide layer. In contrast to the temporary alignment marks, the first and second alignment marks can be etched into the substrate itself.

For best results, it may be desirable to provide a plurality of first and second alignment marks, e.g. in order to provide a plurality of locations to check the alignment. For example, it may be desirable to provide three or more first alignment marks, the first alignment marks possibly not all being arranged in a straight line. Such an arrangement may enable the alignment to be better checked in the full two dimensions of the surface of the substrate. Similarly, it may be desirable to provide three or more second alignment marks, the second alignment marks possibly not all being arranged in a straight line. The first and second alignment marks may or may not be arranged directly opposite each other on either side of the substrate.

The surfaces of the substrate may be protected by a protective layer arranged over the substrate (or over the temporary layer, if one is present). The protective layer may then be removed just prior to the removal of the temporary layer.

A device manufacturing method according to a further embodiment of the invention includes providing a substrate with a temporary alignment mark; providing a first alignment mark on the same surface of the substrate as the temporary alignment mark; turning over the substrate; using an alignment system to align the substrate using the temporary alignment mark; providing a second alignment mark on a different surface of the substrate from the first alignment mark; and using the first and second alignment marks to align the substrate in forming a process layer on the substrate.

Whilst specific embodiments of the invention have been described above, it will be appreciated that the invention as claimed may be practiced otherwise than as described. For example, embodiments of the method may also include one or more computers, processors, and/or processing units (e.g. arrays of logic elements) configured to control an apparatus to perform a method as described herein, or a data storage medium (e.g. a magnetic or optical disk or semiconductor memory such as ROM, RAM, or flash RAM) configured to include instructions (e.g. executable by an array of logic elements) describing such a method. It is explicitly noted that the description of these embodiments is not intended to limit the invention as claimed.

What is claimed is:

1. A method of measurement, said method comprising:
    detecting light outgoing from at least a portion of a first alignment mark of a substrate, the first alignment mark being at a first surface of the substrate;
    based on said detecting, determining a relative position of the first alignment mark and a second alignment mark of the substrate, the second alignment mark being at a second surface of the substrate opposite to the first substrate; and
    removing the first alignment mark from the substrate.

2. The method of measurement according to claim 1, wherein said removing the first alignment mark includes removing at least a portion of a layer from the substrate.

3. The method of measurement according to claim 2, wherein the layer consists essentially of a dielectric material.

4. The method of measurement according to claim 2, wherein the layer includes at least one among an oxide and a nitride.

5. The method of measurement according to claim 1, said method further comprising forming a layer over the first alignment mark.

6. The method of measurement according to claim 1, said method further comprising determining a relative position of the second alignment mark and a third alignment mark, the third alignment mark being at the first surface of the substrate.

7. The method of measurement according to claim 6, wherein said determining a relative position of the second alignment mark and a third alignment mark includes determining a position of the third alignment mark while the substrate is in a first orientation, and
wherein said determining a relative position of the first alignment mark and a second alignment mark is performed while the substrate is in a second orientation, and
wherein the substrate in the second orientation is turned over with respect to the substrate in the first orientation.

8. The method of measurement according to claim 7, wherein said determining a relative position of the first alignment mark and a second alignment mark includes detecting light outgoing from both of the first and second surfaces of the substrate while the substrate is in the second orientation.

9. The method of measurement according to claim 6, wherein the first alignment mark extends only into a surface layer of the substrate, and
wherein the second and third alignment marks extend into a portion of the substrate under the surface layer.

10. The method of measurement according to claim 1, said method further comprising determining a relative position of the second alignment mark and a plurality of third alignment marks, the third alignment marks being at the first surface of the substrate.

11. The method of measurement according to claim 10, wherein the plurality of third alignment marks includes at least three alignment marks, each of the three alignment marks being arranged noncollinearly with respect to the other two.

12. The method of measurement according to claim 10, wherein at least one of the plurality of second alignment marks and at least one of the plurality of third alignment marks are substantially directly opposite one another.

13. The method of measurement according to claim 10, wherein at least one of the plurality of second alignment marks and at least one of the plurality of third alignment marks are not directly opposite one another.

14. The method of measurement according to claim 1, said method further comprising determining a relative position of the first alignment mark and a plurality of second alignment marks, the second alignment marks being at a second surface of the substrate opposite to the first surface,
wherein said determining a relative position of the first alignment mark and a plurality of second alignment marks is based on said detecting light outgoing from at least a portion of a first alignment mark.

15. The method of measurement according to claim 14, wherein the plurality of second alignment marks includes at least three alignment marks, each of the three alignment marks being arranged noncollinearly with respect to the other two.

16. The method of measurement according to claim 1, said method further comprising determining a position of a third alignment mark, the third alignment mark being at the first surface of the substrate,
wherein said determining a position of a third alignment mark includes detecting light outgoing from at least a portion of the third alignment mark, and
wherein said detecting outgoing from at least a portion of the third alignment mark occurs at a location on the same side of the substrate as the first surface.

17. The method of measurement according to claim 16, wherein the first alignment mark extends only into a surface layer of the substrate, and
wherein the third alignment mark extends into a portion of the substrate under the surface layer.

18. The method of measurement according to claim 1, said method further comprising, based on said detecting, determining a position of the substrate.

19. The method of measurement according to claim 18, said method further comprising, based on said determining a position of the substrate, exposing a radiation-sensitive portion of a layer on the substrate with a patterned beam of radiation.

20. The method of measurement according to claim 19, said method further comprising, based on said exposing, forming a process layer on the substrate.

21. A device manufactured according to the method according to claim 19.

22. The method of measurement according to claim 19, said method further comprising forming functional elements in the substrate at a location from which the first alignment mark was removed.

23. A method of measurement, said method comprising:
detecting light outgoing from at least a portion of a first alignment mark of a substrate, the first alignment mark being at a first surface of the substrate; and
removing the first alignment mark from the substrate,
wherein said detecting occurs at a location on a side of the substrate opposite to the first surface.

24. The method of measurement according to claim 23, said method further comprising:
detecting light outgoing from at least a portion of another first alignment mark, the other first alignment mark being at a first surface of a substrate; and
removing the other first alignment mark from the substrate,
wherein said detecting light outgoing from at least a portion of another first alignment mark occurs at a location on a side of the substrate opposite to the first surface.

25. The method of measurement according to claim 23, said method further comprising detecting a position of the first alignment mark,
wherein said detecting a position of the first alignment mark is based on said detecting light outgoing from at least a portion of a first alignment mark.

26. The method of measurement according to claim 23, wherein said removing the first alignment mark includes removing at least a portion of a layer from the substrate.

27. The method of measurement according to claim 26, wherein the layer consists essentially of a dielectric material.

28. The method of measurement according to claim 26, wherein the layer includes at least one among an oxide and a nitride.

29. The method of measurement according to claim 23, said method further comprising forming a layer over the first alignment mark.

30. The method of measurement according to claim 23, said method further comprising determining a relative position of the first alignment mark and a second alignment mark, the second alignment mark being at a second surface of the substrate opposite to the first surface,
  wherein said determining a relative position of the first alignment mark and a second alignment mark is based on said detecting light outgoing from at least a portion of a first alignment mark.

31. The method of measurement according to claim 30, said method further comprising determining a relative position of the second alignment mark and a third alignment mark, the third alignment mark being at the first surface of the substrate.

32. The method of measurement according to claim 31, wherein the first alignment mark extends only into a surface layer of the substrate, and
  wherein the second and third alignment marks extend into a portion of the substrate under the surface layer.

33. The method of measurement according to claim 30, said method further comprising determining a relative position of the second alignment mark and a plurality of third alignment marks, the third alignment marks being at the first surface of the substrate.

34. The method of measurement according to claim 33, wherein the plurality of third alignment marks includes at least three alignment marks, each of the three alignment marks being arranged noncollinearly with respect to the other two.

35. The method of measurement according to claim 23, said method further comprising determining a relative position of the first alignment mark and a plurality of second alignment marks, the second alignment marks being at a second surface of the substrate opposite to the first surface,
  wherein said determining a relative position of the first alignment mark and a plurality of second alignment marks is based on said detecting light outgoing from at least a portion of a first alignment mark.

36. The method of measurement according to claim 35, said method further comprising determining a relative position of the second alignment mark and a plurality of third alignment marks, the third alignment marks being at the first surface of the substrate,
  wherein the plurality of third alignment marks includes at least three alignment marks, each of the three alignment marks being arranged noncollinearly with respect to the other two, and
  wherein at least one of the plurality of second alignment marks and at least one of the plurality of third alignment marks are substantially directly opposite one another.

37. The method of measurement according to claim 35, said method further comprising determining a relative position of the second alignment mark and a plurality of third alignment marks, the third alignment marks being at the first surface of the substrate,
  wherein the plurality of third alignment marks includes at least three alignment marks, each of the three alignment marks being arranged noncollinearly with respect to the other two, and
  wherein at least one of the plurality of second alignment marks and at least one of the plurality of third alignment marks are not directly opposite one another.

38. The method of measurement according to claim 35, wherein the plurality of second alignment marks includes at least three alignment marks, each of the three alignment marks being arranged noncollinearly with respect to the other two.

39. The method of measurement according to claim 23, said method further comprising, based on said detecting, determining a position of the substrate.

40. The method of measurement according to claim 39, said method further comprising, based on said determining a position of the substrate, exposing a radiation-sensitive portion of a layer on the substrate with a patterned beam of radiation.

41. The method of measurement according to claim 40, said method further comprising, based on said exposing, forming a process layer on the substrate.

42. A device manufactured according to the method according to claim 40.

43. A substrate comprising:
  a first alignment mark formed at a first surface of the substrate;
  a second alignment mark formed at the first surface of the substrate;
  wherein the first alignment mark is formed in a first layer of the substrate, and
  wherein the second alignment mark is formed in a second layer of the substrate, the second layer being on the first layer.

44. The substrate of claim 43, said substrate further comprising a third alignment layer formed at a second surface of the substrate different than the first surface.

45. The substrate of claim 43, wherein the second alignment mark does not extend into the first layer.

46. The substrate of claim 43, wherein the second layer consists essentially of at least one of a nitride and an oxide.

47. A method of measurement comprising:
  providing a substrate having a temporary alignment mark and a first alignment mark, said marks being at a first surface of a substrate;
  turning over the substrate;
  determining a position of the substrate, based on light outgoing from at least a portion of the temporary alignment mark and detected at a location on a side of the substrate opposite to the first surface; and
  providing a second alignment mark of the substrate at a second surface of the substrate different from the first surface.

48. The method of measurement according to claim 47, said method further comprising removing the temporary alignment mark from the substrate.

* * * * *